(12) United States Patent
Liu

(10) Patent No.: US 7,583,754 B2
(45) Date of Patent: Sep. 1, 2009

(54) METHOD AND SYSTEM FOR BROADBAND PREDISTORTION LINEARIZATION

(75) Inventor: Xiaowei Liu, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 584 days.

(21) Appl. No.: 10/533,494

(22) PCT Filed: Oct. 31, 2002

(86) PCT No.: PCT/CN02/00774

§ 371 (c)(1),
(2), (4) Date: May 10, 2006

(87) PCT Pub. No.: WO2004/040870

PCT Pub. Date: May 13, 2004

(65) Prior Publication Data

US 2006/0240786 A1 Oct. 26, 2006

(51) Int. Cl.
*H04K 1/02* (2006.01)
(52) U.S. Cl. ................ 375/297; 375/278; 375/295; 375/296; 455/114.3
(58) Field of Classification Search ............. 375/254, 375/278, 295–297; 330/136, 250, 262–263, 330/268, 273–275; 455/67.11, 67.13, 91, 455/114.2, 114.3, 501
See application file for complete search history.

(56) References Cited

U.S. PATENT DOCUMENTS

| | | | | |
|---|---|---|---|---|
| 5,929,703 A * | 7/1999 | Sehier et al. | ............... | 330/149 |
| 5,959,500 A * | 9/1999 | Garrido | ................. | 330/151 |
| 6,141,390 A * | 10/2000 | Cova | ..................... | 375/297 |
| 6,316,994 B1 * | 11/2001 | Frecassetti et al. | ......... | 330/149 |
| 6,320,463 B1 * | 11/2001 | Leva et al. | ................... | 330/149 |
| 6,356,146 B1 * | 3/2002 | Wright et al. | ................. | 330/2 |
| 6,437,644 B1 * | 8/2002 | Kenington | ................... | 330/149 |
| 6,462,617 B1 * | 10/2002 | Kim | ................................ | 330/2 |
| 6,476,670 B1 * | 11/2002 | Wright et al. | ................. | 330/2 |
| 6,600,792 B2 * | 7/2003 | Antonio et al. | ............. | 375/297 |

(Continued)

FOREIGN PATENT DOCUMENTS

CN 1285089 2/2001

(Continued)

*Primary Examiner*—Mohammad H Ghayour
*Assistant Examiner*—Sophia Vlahos
(74) *Attorney, Agent, or Firm*—Harness, Dickey & Pierce, P.L.C.

(57) ABSTRACT

The invention relates to a method and system for wideband digital pre-distortion linearization, which is used to overcome the influence of memory effect in radio frequency power amplifier, to expand digital pre-distortion linearization bandwidth, and to improve digital pre-distortion linearization performance. The method and system can get an in-band pre-distortion signal and an out-of-band pre-distortion signal according to the characteristic parameter of the amplifier; the in-band pre-distortion signal is up-converted and the up-converted signal is added to the out-of-band pre-distortion signal, which is not up-converted, then the combined signal is inputted to the power amplifier as an input signal; a part of the output signal from the power amplifier, serving as a feedback signal, can be compared with the original input signal, and the characteristic parameter of the amplifier for generating the in-band pre-distortion signal and the out-of-band pre-distortion signal is adaptively regulated according to the comparison result, so that the waveform of time domain or the frequency domain of the feedback signal can be close to that of the original input signal as much as possible.

21 Claims, 11 Drawing Sheets

U.S. PATENT DOCUMENTS

| | | | |
|---|---|---|---|
| 6,717,464 B2 * | 4/2004 | Fudaba et al. | 330/149 |
| 6,903,604 B2 * | 6/2005 | Kim | 330/2 |
| 6,928,122 B2 * | 8/2005 | Opas et al. | 375/296 |
| 7,053,709 B1 * | 5/2006 | Darvish-Zadeh et al. | 330/149 |
| 7,194,043 B2 * | 3/2007 | Ma | 375/296 |
| 7,321,635 B2 * | 1/2008 | Ocenasek et al. | 375/297 |

FOREIGN PATENT DOCUMENTS

| | | |
|---|---|---|
| CN | 1335699 | 2/2002 |
| CN | 1341992 | 3/2002 |
| WO | 01/05026 | 1/2001 |

* cited by examiner

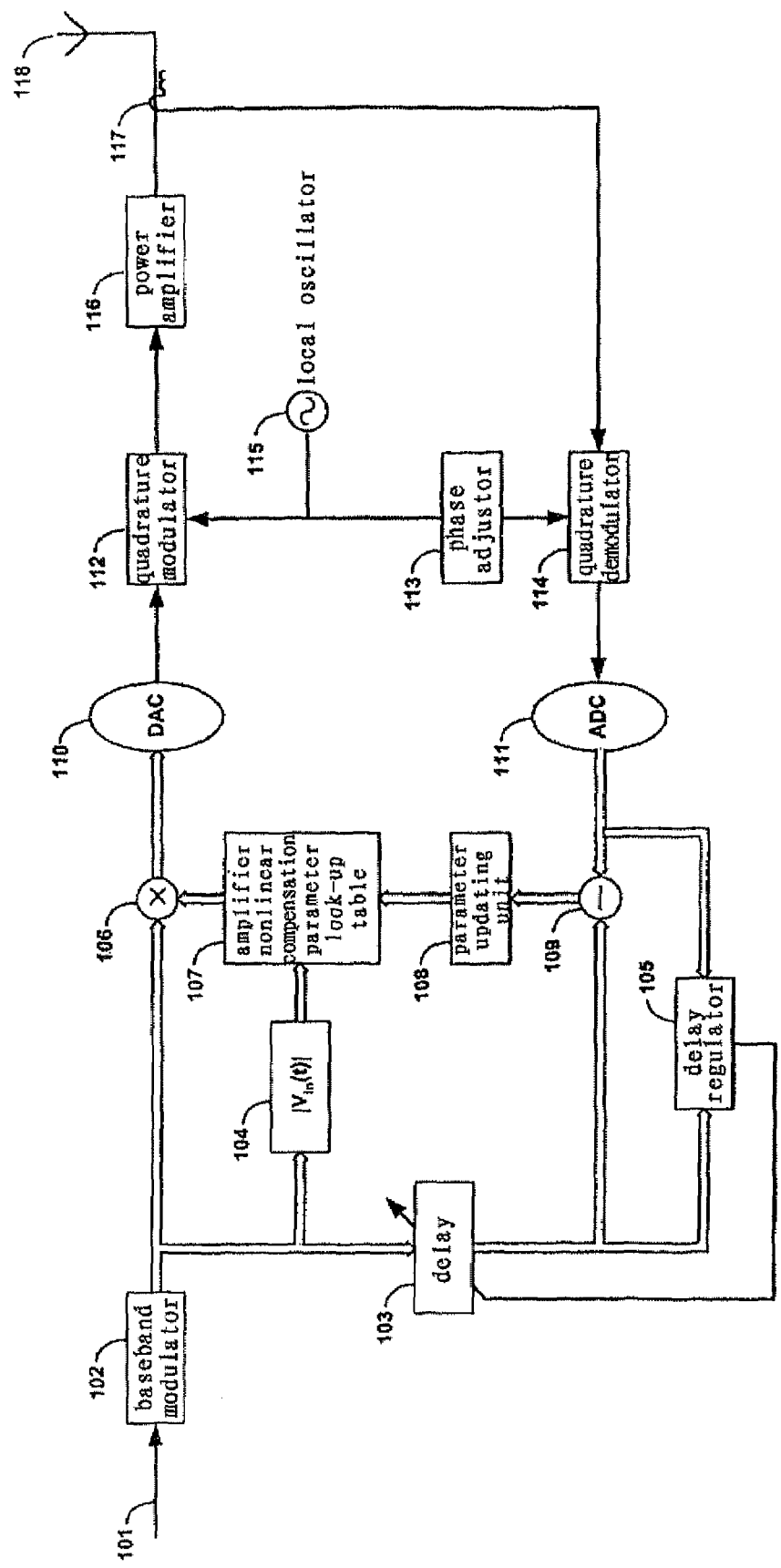
Prior Art  Fig. 2

METHOD AND SYSTEM FOR BROADBAND PREDISTORTION LINEARIZATION

FIELD OF THE INVENTION

The present invention relates to a method and system for linearization of radio transmitter, more particularly, to a method and system using the wideband digital pre-distortion linearization technique to improve the linearity of the radio transmitter.

BACKGROUND OF THE INVENTION

In recent years, the lack of the radio spectrum resources is more serious with the rapid development of the radio communication. Linear modulation that has higher utilization efficiency is adopted in many radio communication systems in order to make use of the limited spectrum resources more efficiently. Since both the phase and amplitude of the linear modulation signal carry useful information, any nonlinear amplification of such signal will result in the increasing of the error rate and the interference between adjacent radio channels, which should be avoided when designing a radio communication system. It is necessary to amplify the linear modulation signal with high linearity in order to avoid those two harmful effects when designing radio communication system.

The conventional method for improving the linearity of the radio frequency (RF) amplifier is to set the output power of the amplifier much lower than 1 dB compression point, i.e., to use a small part of relatively linear input-output characteristics of the radio frequency power amplifier to achieve high-linearity amplification, which is called power backoff. However, there are obvious disadvantages in the backoff technique. First, the high linearity is achieved at the expense of power efficiency, which means that it does not make use of the most of the power output capacity of the amplifier, and therefore the power efficiency of the amplifier is reduced and the cost of the amplifier is increased; secondly, low power efficiency means that most power will be dissipated in the form of heat, which will be a heavy load to the ventilating and dispersing system of the whole base station; finally, the low efficiency power amplifier needs a power supply system of higher capacity, which is also an important factor leading to the increase of the cost of the transmitter. In order to improve the power efficiency of the amplifier and reduce the cost of the transmitter, the most common way is to set the power amplifier in the state of low linearity and high power efficiency, and then to improve the linearity of the amplifier from outside by certain measures and those measures are generalized as linearization techniques.

The conventional linearization techniques include the feedforward linearization technique and the feedback linearization technique. These two techniques are widely used in various radio communication systems. However, both of them have disadvantages: the main problems of the feedforward linearization technique include low efficiency, complex structure and high cost of the amplifier; the feedback linearization technique has the problem of loop stability or bandwidth limitation. Accordingly, neither of these two techniques can provide wideband amplification with high linearity at the power efficiency level required by the next generation mobile communication base station.

Another commonly used linearization technique is pre-distortion technique, which can achieve higher power efficiency than the feedforward technique. The difference between the pre-distortion technique and the feedforward technique is that the compensation is implemented before amplification, i.e., the input signal is pre-distorted in advance, so that the overall effects of the signal obtained by pre-distortion and nonlinear amplification is close to what obtained by linear amplification. There are three kinds of pre-distortion technologies, i.e. digital baseband pre-distortion, analog baseband or intermediate frequency pre-distortion, and RF pre-distortion. Among the three, digital baseband pre-distortion technique based on the adaptation of the digital signal processing is developing rapidly in recent years. In conventional pre-distortion technique, the pre-distortion compensation parameter calculated in advance is stored in a single dimensional pre-distortion look-up table, and then an address value is calculated on the basis of the magnitude of the current input signal, after locating the corresponding pre-distortion compensation parameter at the corresponding position of the pre-distortion look-up table, the input signal is corrected by an algorithm (e.g. adding or multiplying with the original signal). The way of determining the compensation parameter in the table is to have the nonlinear effect of the amplifier compensated exactly by the pre-distortion signal.

In order to make the compensation effect of the pre-distortion linearization track the changes of the amplifier characteristics due to the external factors, such as seasons, weather, environment and so forth, and the internal factors, such as the operation point of the amplifier, the shift of the amplifier characteristics along with the term of use, a feedback branch is usually required. A part of the output of the amplifier is coupled to this feedback branch as the feedback reference signal, and adjusts the pre-distortion parameters in the pre-distortion look-up table based on the difference between the input signal and the feedback signal. Since it is impossible for the amplifier characteristics to change markedly in a very short period of time, the adjustment is usually a nonreal-time process.

However, the linearization bandwidth and the linearization performance provided by the digital pre-distortion linearization solution are both limited without taking some special measures, because there are some memory effects in the amplifier. The existence of the memory effects greatly influences the performance of the pre-distortion, and the wider the bandwidth, the more serious the effects of the memory effects. From point of view of time domain, when the memory effect exists, the distortion characteristics are related not only to the current input but also the previous inputs of the amplifier; and from the point of view of frequency domain, the memory effect means that the amplitude and phase of the nonlinear distortion components of the amplifier vary with the change of the modulation frequency of the input signal, and such a variable distortion signal cannot be completely compensated by means of the pre-distortion signal having fixed amplitude and phase.

FIG. 1A-D shows nonlinear intermodulation distortion of the amplifier when memory effects exist and do not exist.

FIG. 1A shows the situation when no memory effect exists in the amplifier. New components will be generated by nonlinearity of the amplifier after a two-tone input signal is amplified by the amplifier, wherein IM3L (lower sideband third-order nonlinear intermodulation distortion component) and IM3H (upper sideband third-order nonlinear intermodulation distortion component) are generated in the lower sideband and upper sideband of the two-tone signal respectively by the third-order nonlinearity of the amplifier, because there is no memory effect in the amplifier, the amplitude and phase of IM3L are equal to that of IM3H respectively. FIG. 1A only shows the amplitude components of the intermodulation distortion signals.

FIG. 1B shows the case when memory effect exists in the amplifier. The amplitude of IM3L is not equal to that of IM3H due to the memory effect of the amplifier. The asymmetry of the amplitudes in the intermodulation distortion components is usually caused by the electrical memory effect of the amplifier. Although only the amplitudes of IM3L and IM3H are shown in the drawings, it does not necessarily mean that their phases are equal. Actually, neither the amplitude nor the phase of IM3L is equal to that of IM3H under normal conditions.

FIG. 1C-D shows another case when the memory effect exists in the amplifier. Although the amplitudes of IM3L and IM3H are equal, as shown in FIG. 3C, their phases are not equal actually. The asymmetry of the phases in the intermodulation distortion components is usually caused by the thermal memory effect of the amplifier. Suppose a pre-distortion signal having equal magnitude and opposite phase with respect to IM3L, it can only compensate IM3L exactly, but it can not compensate IM3H, finally, the resulted signal is the vectorial resultant of this pre-distortion signal and IM3H. Apparently, the resultant signal is not zero when $\phi \neq 0$, and may be no less than the amplitude of IM3H before being compensated ($\phi \geq 30°$).

Because the amplitudes and the phases of the intermodulation distortion compensation components of IM3L and IM3H generated based on the in-band nonlinear distortion characteristic of the amplifier are in conformity with each other, the fact that the memory effect shown in FIG. 1B-D will cause IM3L and IM3H to be asymmetry, which will affect the pre-distortion linearization performance seriously.

The symmetrical compensation signals cannot compensate un-symmetrical IM3L and IM3H completely due to the memory effect, because the result of pre-distortion compensation is very sensitive to the match of amplitude and phase between the compensation signals and the distortion signals.

Since the digital pre-distortion linearization solution generally determines the compensation parameters according to the in-band nonlinear distortion characteristic, i.e., the conversion characteristic of amplitude modulation to amplitude modulation and amplitude modulation to phase modulation (hereafter called AM-AM & AM-PM characteristic of the amplifier), and this kind of characteristic can only describe the intermodulation distortion in which the upper sideband and the lower sideband are completely symmetrical, and thus the determined compensation parameters can only compensate the intermodulation distortion in which the upper sideband and the lower sideband are completely symmetrical. However, the memory effect will cause asymmetry between the upper sideband and lower sideband intermodulation distortion components, and it is obvious that symmetrical compensation signals cannot compensate un-symmetrical signals.

FIG. 2 is a schematic block diagram showing a typical narrowband digital pre-distortion system of the prior art. An input signal 101 is modulated as digital baseband signal via a baseband modulator 102, and the signal generates an address signal via an addressing circuit 104, while the address signal is in proportion to the amplitude of the input signal. A corresponding compensation parameter is searched from the corresponding unit of a compensation parameter look-up table 107, and the compensation parameter is multiplied by the original modulation signal via a complex number multiplier 106 to generate a corrected pre-distortion signal. The pre-distortion signal is converted to analog baseband via a digital/analog converter 110, this pre-distortion signal is modulated to radio frequency via a quadrature modulator (up converter) 112, then it is transmitted via a transmitting antenna 118 after amplified by a power amplifier 116. A part of the output power of the power amplifier 116 is coupled to a directional coupler 117, and then quadrature-demodulated and down converted to an analog baseband via a quadrature demodulator (down converter) 114, and the feedback signal is converted to a digital baseband via an analog/digital converter 111. In the digital baseband, the feedback signal is compared with the original signal delayed by a delay 103 in a signal comparator 109, and the resulted error signal is used to control a parameter updating unit 108 to generate a parameter updating signal for updating the nonlinear compensating parameters of the amplifier in the compensation parameter look-up table 107. The delay of the delay 103 is regulated by a delay regulator 105, which obtains a delay-regulating signal by comparing the original input signal delayed by the delay 103 with the feedback signal. The carrier frequency signal of the device is provided by a local oscillator 115 to the quadrature modulator 112 and the quadrature demodulator 114, and a phase regulator 113 is disposed between the local oscillator 115 and the quadrature demodulator 114, which is used to regulate the RF phase difference between the forward amplifying branch and the feedback branch, so as to keep the whole system stable. Because such a compensation device corrects the non-linearity based on the magnitudes of current signals and the AM-AM & AM-PM characteristics of the amplifier, without taking into consideration of the memory effects of the amplifier, hereby it can only compensate the memoryless nonlinear distortion near the predetermined frequency point, so that the linearization performance achieved by the device and the linearization bandwidth provided by the device are limited.

U.S. Pat. No. 6,356,146 discloses an improved solution for the narrowband digital pre-distortion compensation solution shown in FIG. 2, as shown in FIG. 3, it includes: (1) changing the multiplication of the complex gain correction into a filtering compensation of a finite impulse response (FIR) filter, the advantage of such compensation consists in that the case that compensation changing with frequency is taken into consideration; (2) the parameters of the FIR filter 206 are saved in a three-dimensional compensation parameter data structure 207. The data structure has three address retrieval entries, i.e. amplitude retrieval entry 204A, differential retrieval entry 204B and integral retrieval entry 204C, as shown in the drawing, the whole data structure is three-dimensional, the compensation coefficient can be obtained by addressing the three retrieval entries, which is related to the amplitude of the current input signal, the integral value of the input signal (indicating the effects of previous signals) and the differential value of the input value (indicating the bandwidth of the input signal). The compensation relates to not only the amplitude of the current signal, but also the previous input signals and the change rate of the input signals, with such improvement, hereby this device can compensate the nonlinear characteristics varying with the modulation frequency and the time changing nonlinear characteristics of the amplifier. The retrieval entries of the three-dimensional compensation parameter data structure 207 are not limited to the above-mentioned three ones, FIG. 3 shows another retrieval mode instead of the integral retrieval entry 204C, in which the change of the temperature of the amplifier is sensed by a temperature sensor 219, then the sensed signal is converted to the digital band via digital/analog converter 211, and the address value of the corresponding dimension is calculated by a address retrieval calculator 204D. The FIR filter 206, the three-dimensional compensation parameter data structure 207, the amplitude retrieval entry 204A, the differential retrieval entry 204B and the integral retrieval entry 204C are named distortion compensation signal processor 220. This compensation solution takes the AM-AM & AM-PM characteristic of the amplifier which varies with time and the modulation frequency of the input signal into consideration, thus its compensation effect is better than the narrowband digital pre-distortion compensation solution shown in FIG. 2, and also the linearization bandwidth provided is wider. However, this solution is still based on the in-band AM-AM & AM-PM characteristic of the amplifier, its pre-distortion signals of the upper sideband and the lower sideband are symmetrical in frequency spectrum, but the memory effect is an out-of-band distortion and will usually result in the intermodulation distortion, in which the upper sideband and the lower sideband are not symmetrical, thus this kind of solution can not compensate the memorial nonlinear characteristics of the amplifier.

Contrary to the pre-distortion technique, the linearization performance of the feedforward technique is not affected by the memory effect, mainly because the signal is compensated after being amplified by an amplifier. The advantages of feedforward technique in terms of linearization bandwidth and the linearization performance lie in that it is not sensitive to the memory effects. If the problem of being sensitive to the memory effects in predistortion technique can be resolved, the technique will reach or exceed the level of feedforward technique in terms of the linearization bandwidth and the linearization performance.

SUMMARY OF THE INVENTION

One object of the present invention is to provide a method for wideband pre-distortion linearization and a system based on the method, which can remove the limitation to the linearization performance achieved and the linearization bandwidth provided by digital pre-distortion linearization technique due to the memorial non-linearity in the RF power amplifier, so as to improve the linearization performance achieved and the linearization bandwidth provided by the digital pre-distortion linearization technique greatly.

Another object of the present invention is to provide a circuit and system based on digital pre-distortion linearization technique for the radio transmitter in the filed of wireless communication, which can simplify the existing digital pre-distortion technique greatly, and provide wider linearization bandwidth and better linearization performance than the existing pre-distortion systems at low cost.

The above-mentioned object of the present invention is achieved by providing a wideband digital pre-distortion linearization method and a wideband digital pre-distortion linearization system.

The wideband pre-distortion linearization method according to the present invention comprises the following steps:

performing in-band pre-distortion compensation for an input signal according to the characteristics of an amplifier, and obtaining an in-band pre-distortion signal;

Performing out-of-band pre-distortion compensation for the input signal according to the characteristics of the amplifier, and obtaining an out-of-band pre-distortion signal;

up-converting the in-band pre-distortion signal;

adding the up-converted in-band pre-distortion signal to the out-of-band pre-distortion signal which is not up-converted at the input of a power amplifier;

inputting the added signal to the power amplifier as an input signal;

coupling a part of the output of the power amplifier as a feedback signal and comparing it with the original input signal;

regulating adaptively the characteristic parameter of the amplifier for generating the in-band pre-distortion signal and the out-of-band pre-distortion signal according to the comparison result, so that the waveform of time domain or the frequency spectrum of the feedback signal can be quite close to that of the original input signal.

The wideband pre-distortion system according to the present invention comprises an in-band signal pre-distortion processing unit, a quadrature modulator (up converter), an out-of-band signal pre-distortion processing unit, an signal adder, a power amplifier, a quadrature demodulator (down converter), and an adaptive model parameter exacting unit; wherein, one part of an input signal is used to generate an in-band pre-distortion signal via the in-band signal pre-distortion processing unit, and another part of the input signal is used to generate an out-of-band pre-distortion signal via the out-of-band signal pre-distortion processing unit; the in-band pre-distortion signal is modulated and up-converted to a carrier frequency via the quadrature modulator (up converter), and then added directly with the out-of-band pre-distortion signal which is not up-converted at the signal adder; the added signal is transmitted an antenna after being amplified by the power amplifier; a part of the output signal of the amplifier is provided to the adaptive model parameter exacting unit as a feedback signal, after being quadrature-demodulated and down-converted by the quadrature demodulator; the unit compares the feedback signal with the original input signal and generates a parameter updating signal based on the comparison result, the parameter updating signal is provided to the in-band signal pre-distortion processing unit and the out-of-band signal pre-distortion processing unit to adaptively regulate a pre-distortion compensation parameter required by the in-band signal pre-distortion processing unit and the out-of-band signal pre-distortion processing unit.

The method and system according to the present invention can compensate the non-linearity with memory effect of the amplifier, and more particularly, compensate the intermodulation distortion due to the memory effect, in which the upper sideband and the lower sideband are not symmetrical. Comparing to the digital pre-distortion technique of the prior art, the present invention removes the limitation to the pre-distortion performance caused by the memory effect radically, improves the linearization performance of the digital pre-distortion greatly and extends the linearization bandwidth of the digital pre-distortion.

Another advantage of the method and system according to the present invention is that it can simplify the complexity of the digital pre-distortion linearization system greatly, and reduce the cost of the system significantly.

BRIEF DESCRIPTION OF THE DRAWINGS

FIG. 2 is a block diagram showing a typical narrowband digital pre-distortion compensation system of the prior art;

FIG. 4 is a schematic block diagram of a wideband pre-distortion linearization system with the features of the present invention;

FIG. 5 is a block diagram showing an in-band signal pre-distortion processing unit;

FIG. 6 is a block diagram showing an out-of-band signal pre-distortion processing unit;

FIG. 7 is a block diagram showing a thermal FIR filter for eliminating the thermal memory effect of the amplifier;

FIG. 8 is a block diagram showing an electrical FIR filter for eliminating the electrical memory effect of the amplifier;

FIG. 9 is a block diagram showing the working principle of the adaptive model parameter exacting unit;

FIG. 10 is a flow chart showing the identification algorithm for amplifier model parameters;

FIG. 11 is a flow chart showing the adaptive regulation algorithm for amplifier model parameters.

DETAILED DESCRIPTION OF THE INVENTION

Figures 1A, 1B:
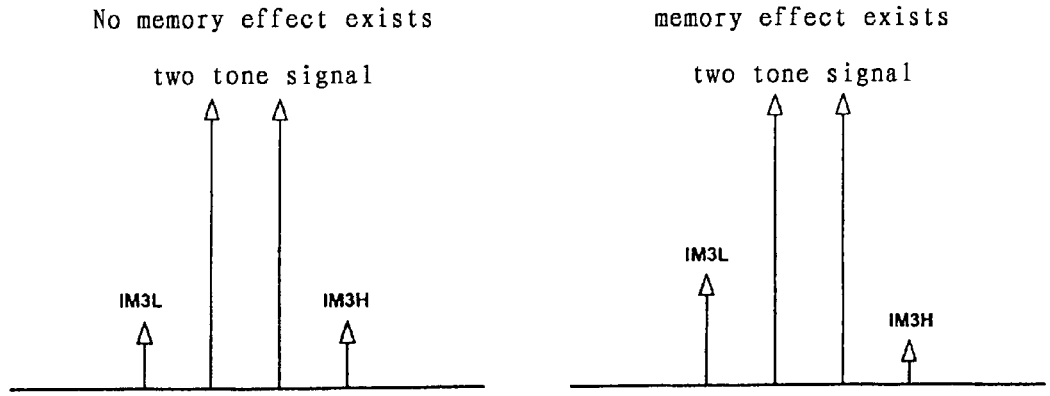
FIG. 1A-D are schematic diagrams showing the comparison of the nonlinear intermodulation distortion of the amplifier between the case when memory effects exist and the case when no memory effect exists.
Figures 1C, 1D:
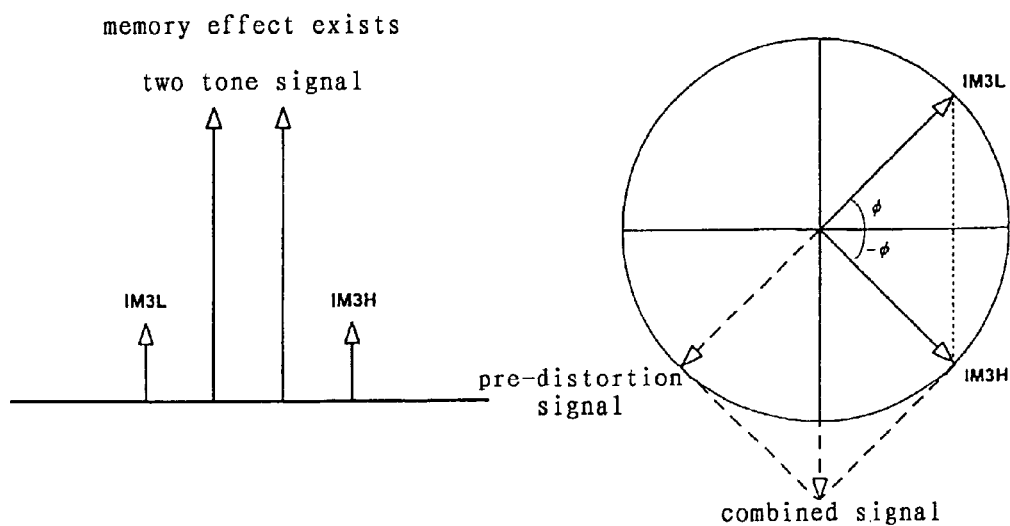
Figure 3:
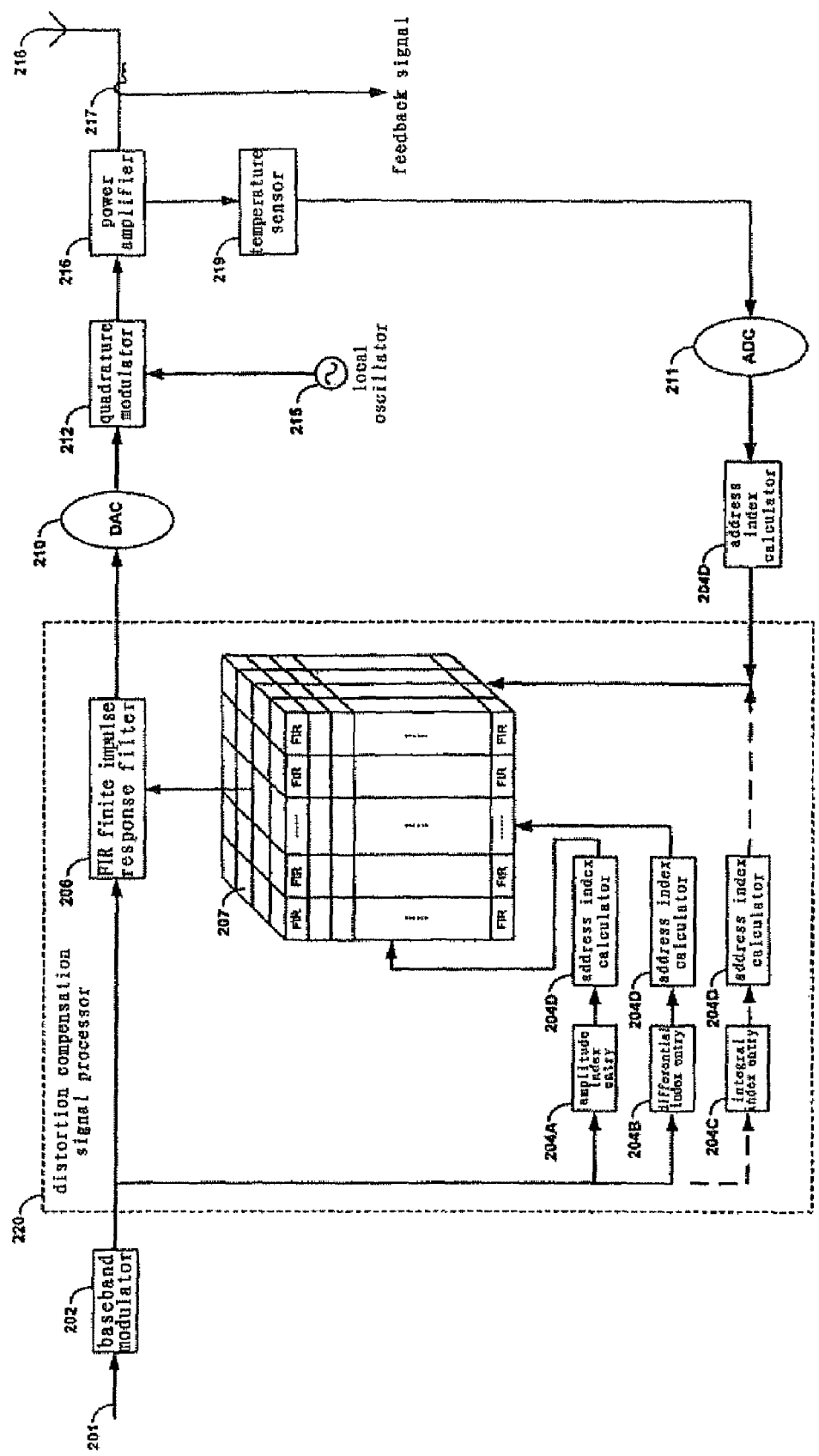
FIG. 3 is a block diagram showing a pre-distortion compensation solution that takes into consideration of the AM-AM & AM-PM nonlinear distortion characteristic varying with time and the modulation frequency of an input signal.

According to the method of the present invention, the nonlinear characteristic with memory effects in the power amplifier is compensated in band and out of band simultaneously, wherein the memory effect is compensated by means of an out-of-band pre-distortion signal; the memoryless nonlinear characteristic is compensated mainly by means of an in-band pre-distortion signal.

The in-band pre-distortion signal includes three parts. The first part is used to compensate the nonlinear distortion with regard to the AM-PM distortion characteristic of the power amplifier (the AM-AM distortion of the amplifier can also be compensated simultaneously, but this will make the present invention complicated), and this part of compensation signal is only associated with the amplitude of the current input signal. The second part is used to compensate linear distortion relating to the modulation frequency of the input signal (the compensation of this part is optional), such as linear frequency distortion relating to the digital/analog converter (DAC) and the analog/digital converter (ADC), this part of compensation signal is associated not only with the amplitude of the current input signal, but also with the previous input signals. The third part is optional too, and is used in the system making use of quadrature modulation/demodulation, to compensate the distortion associated with the nonideal I/Q channel modulation/demodulation characteristics. Because the present invention realizes the compensation of the undesired characteristics of digital analog conversion/analog digital conversion and of modulation/demodulation, the present invention (it) can linearize not only the power amplifier as a part of the radio transmitter, but also the whole radio transmitter.

Out-of-band pre-distortion signal has the same meaning as envelope injection signal. Out-of-band pre-distortion signal includes three parts. The first part is used to compensate thermal memory effect in the amplifier; the second part is used to compensate the electrical memory effect in the amplifier; the third part is used to compensate distortion relating to the AM-AM distortion characteristic of the amplifier, and this part is optional because compensation for AM-AM distortion can also be processed in band, however, this will make the present invention complicated.

The in-band compensation of the present invention means the pre-distortion correction for the original signal is processed in baseband, and the corrected signal is up-converted to carrier frequency. Conventional pre-distortion compensations belong to this kind of in-band compensation. However, such pre-distortion compensation can only compensate the intermodulation distortion, in which the upper sideband and lower sideband are symmetrical, when the upper sideband and lower sideband components of the intermodulation distortion are not symmetrical, i.e. when the amplifier exhibits memory effect, this kind of compensation is incomplete. In order to compensate the intermodulation in which the upper sideband and the lower sideband are not symmetrical, a convenient way is to use out-of-band compensation.

The out-of-band compensation of the present invention means the pre-distortion correction for the original signal is processed in baseband, and then the corrected signal is not up-converted, but is directly added to the up-converted in-band pre-distortion signal at the input of the amplifier. A suitable out-of-band signal can compensate nonlinear distortion in which the upper sideband and the lower sideband are not symmetrical which is caused by the memory effect.

In the present invention, memory effect is defined as the effect that nonlinear intermodulation distortion component changes with the modulation frequency of the baseband. The memory effect is classified as thermal memory effect and electrical memory effect according to the generation mechanism.

The thermal memory effect in an amplifier is mainly caused by internal electro-thermal coupling within the amplifier. Electro-thermal coupling is a phenomenon that the change of the power consumption of the amplifier will cause the change of the chip surface temperature, and the change of the chip surface temperature will cause the change of the electrical characteristic of the amplifier. This kind of phenomenon is also called as thermal power feedback effect, electro-thermal feedback effect or self-heating effect. The thermal dissipation power created by the amplifier diffuses into environment via a thermal low-pass filter constituted by the thermal resistance between different parts of the apparatus and the thermal capacity of the parts themselves, and forms the quasi-static temperature distribution on the chip surface. Since thermal low-pass filter will introduce a time delay changing with the modulation frequency between the thermal dissipation power and the chip surface temperature, the change of temperature caused by the thermal dissipation power is not instantaneous, and there is always a phase shift depending on frequency, which causes the thermal memory effect.

The thermal memory effect mainly affects the intermodulation distortion at low modulation frequency, and the effect will cause asymmetry of the intermodulation distortion components. Further more, the behaviors of the thermal memory effect are determined by thermal properties and the electrical properties within the transistors.

The electrical memory effect of an amplifier is mainly caused by the input impedance of the amplifier changing with the modulation frequency of the input signal. It is rather easy for the amplifier to maintain the input impedance constant in the range of the whole fundamental frequency band and second harmonic frequency band because the range of modulation frequency is just a small part of the center frequency, however, the variation of input impedance of the amplifier will become very large in the range of baseband modulation frequency. Under normal conditions, the main part of the memory effect is caused by the changes of the input impedance with the input signal modulation frequency at baseband modulation frequency, and the contribution to the memory effect by the first harmonic and the second harmonic is very little. Therefore, elimination of electrical memory effect of an amplifier mainly means eliminating the electrical memory effect caused by the change of the input impedance of the amplifier changing with the modulation frequency of the input signal at the baseband modulation frequency.

The electrical memory effect mainly affects the intermodulation distortion at a higher modulation frequency of input signal, and it will cause the asymmetry of the intermodulation distortion components of the upper sideband and the lower sideband. Unlike thermal memory effect, the creation of the electrical memory effect is mainly decided by the characteristics of the external biasing circuit of the transistors, from this aspect, the electrical memory effect hardly interacts with thermal memory effect, and vice versa, or the influence on each other is negligible, so each of them can be regarded as an independent effect approximately.

More detailed analysis of the thermal memory effect and electrical memory effect within an amplifier can be obtained from "Analysis, measurement and cancellation of the bandwidth and amplitude dependence of intermodulation distortion in RF power amplifier", by Joel Vuolevi, University of Oulu, Finland.

Because the in-band pre-distortion signal is divided into three parts, its processing is also divided into three steps, i.e. compensating the memoryless nonlinear distortion of the amplifier, then compensating the linear frequency distortion relating to the input signal modulation frequency of the amplifier, and compensating undesired characteristics of modulation/demodulation. Only the first step is indispensable, the second step and the third step can be optional according to the requirement of system and the requirement of performance. Since the present invention introduces out-of-band pre-distortion compensation, only compensation for AM-PM distortion of the amplifier in band is necessary, which makes the in-band compensation simple.

As mentioned above, out-of-band pre-distortion signal, i.e. the signal at the envelope frequency, is mainly used to compensate the memory effects in the amplifier including thermal memory effect and the electrical memory effect, and also used to compensate AM-AM distortion. The envelope frequency signal is generated according to the characteristic parameters of the amplifier and the input signal. The AM-AM distortion and AM-PM distortion of the amplifier can be compensated by out-of-band pre-distortion and in-band pre-distortion, respectively, the reason for which is that the AM-AM distortion and AM-PM distortion of the amplifier are in quadrature when the whole distortion of the amplifier is small. Ordinary power amplifiers working in class A or class AB meet this condition.

The out-of-band pre-distortion signal and the in-band pre-distortion signal are generated in the corresponding manners in the following three cases, respectively:

(1) When Memory Effect is not Taken into Consideration

It is understood that the memory effect of the amplifier is too little that can be ignored in this case, that is to say, the system does not need high performance, and the performance requirement can be met even if there is no memory effect to be considered.

In this case, the out-of-band pre-distortion signal is associated with parameters of the expression of the amplifier output (for example current), suppose the output current can be represented by (assuming the amplifier has three-order nonlinearity):

$$i_{OUT} = f(v_{IN}, v_{OUT}, T) \quad (1)$$
$$= g_m v_{IN} + K_{2GM} v_{IN}^2 + K_{3GM} v_{IN}^3 +$$
$$g_o v_{OUT} + K_{2GO} v_{OUT}^2 + K_{3GO} v_{OUT}^3 +$$
$$K_{2GMGO} v_{IN} v_{OUT} + K_{3GM2GO} v_{IN}^2 v_{OUT} +$$
$$K_{3GMGO2} v_{IN} v_{OUT}^2 + K_{2T} \cdot T + K_{3TGM} \cdot T \cdot v_{IN} +$$
$$K_{3TGO} \cdot T \cdot v_{OUT}$$

Wherein $g_m$ is the linear transconductance from the input to the output of the amplifier; $K_{2GM}$ is the second order nonlinear coefficient of the transconductance; $K_{3GM}$ is the third order nonlinear coefficient of the transconductance; $g_o$ is the output conductance of the amplifier; $K_{2GO}$ is the second order nonlinear coefficient of the output conductance; $K_{3GO}$ is the third order nonlinear coefficient of the output conductance; $K_{2GMGO}$ is the second order input/output cross transconductance; $K_{3GM\ 2GO}$ is the third order input leading cross transconductance; $K_{3GMGO2}$ is the third order output leading cross transconductance; $i_{out}$ is the output current of the amplifier; $V_{IN}$ is the input voltage of the amplifier; and $V_{OUT}$ is the output voltage of the amplifier. Since effects associated with temperature T of the amplifier is not taken into consideration, the last three terms relating to the temperature on the last line can be ignored. The concrete form of the envelope injection signal is:

$$B(t) = -\frac{3}{8}\frac{a_3}{a_2}[I^2 + Q^2] \quad (2)$$

Here $$a_3 = K_{3GM} + g_V \cdot K_{3GM2GO} + g_V^2 \cdot K_{3GMGO2} + g_V^3 \cdot K_{3GO} \quad (3)$$

$$a_2 = K_{2GM} + g_V \cdot K_{2GMGO} + g_V^2 \cdot K_{2GO} \quad (4)$$

Wherein, $g_v$ is the forward voltage amplification factor from the input to the output port; I and Q are in-phase component and quadrature component of the input signal, respectively, and $I^2+Q^2$ is the power envelope of the input signal.

The corresponding in-band pre-distortion signal at this time is:

$$\begin{cases} dI = -\phi \cdot Q^3 \\ dQ = \phi \cdot I^3 \end{cases} \quad (5)$$

Wherein, $\phi$ is a linear phase conversion coefficient (assuming the phase distortion is of first-order). The in-band pre-distortion signal is mainly used to compensate the distortion due to the AM-PM phase shift. As the AM-AM distortion and AM-PM distortion are compensated respectively, the form of the compensation signal becomes very simple.

(2) When Thermal Memory Effect is Taken into Consideration

Here, thermal memory effect in the amplifier is considered in order to improve the compensation effect. Because the thermal memory effect reflects the influence of the historical signals, the compensation signal takes the form of weighted integral.

The part relating to temperature of the input signal of the amplifier shown in formula (1) is:

$$i_{OUT-T} = K_{2T} \cdot T + K_{3TGM} \cdot T \cdot v_{IN} + K_{3TOO} \cdot T \cdot v_{OUT} \quad (6)$$

Herein, $K_{2T}$ is the second order temperature coefficient; $K_{3TGM}$ is the input temperature cross nonlinear coefficient; and $K_{3TGO}$ is the output temperature cross nonlinear coefficient. The chip surface temperature T can be represented by the following function:

$$T(t)=f(I^2+Q^2) \quad (7)$$

And the envelope injection signal is:

$$B = -\frac{3}{8}\frac{a_3}{a_2}[I^2 + Q^2] - \frac{(K_{3TGM} + g_V K_{3TGO})}{2a_2} \cdot f(I^2 + Q^2) \quad (8)$$

At this time, the envelope injection signal includes one part in proportion to the power envelope of the input signal, and another part in proportion to the chip surface temperature. It should be noted that there a certain phase difference between the chip surface temperature and the input signal, as a result, there exists a phase difference between the former term and the latter term of formula (8). The characteristic of the un-symmetrical intermodulation distortion can be compensated by regulating this phase difference.

In case (2), the in-band pre-distortion signal is same as that in case (1).

However, in formula (8), the form of the chip surface temperature T is unknown, so that the concrete form of the envelope injection signal is undetermined. The chip surface temperature must be determined in order to determine the envelope injection signal. The chip surface temperature of the amplifier can be represented by:

$$T=T_{AMB}+R_{TH}P_{DISS}(dc)+Z_{TH}(\Omega)P_{DISS}(\Omega) \quad (9)$$

Here, the chip surface temperature includes the following three parts: (1) the ambient temperature $T_{AMB}$ of the amplifier; (2) the temperature rise contributed by the DC (operation point) power consumption $P_{DISS}(dc)$; (3) the temperature rise contributed by the AC (envelope signal) power consumption $P_{DISS}(\Omega)$. Wherein, $R_{TH}$ is the DC thermal resistance of the amplifier, $Z_{TH}(\Omega)$ is the AC thermal resistance of the amplifier. Since the ambient temperature $T_{AMB}$ and the temperature rise contributed by the DC (operation point) power consumption $P_{DISS}(dc)$ are constant, it can be considered that the chip surface temperature includes two parts: part $T_{INV}$ which does not change with the input signal and part $T_{VAR}$ which changes with the input signal, and these two parts are defined by:

$$T_{INV}=T_{AMB}+R_{TH}P_{DISS}(dc) \quad (10)$$

$$T_{VAR}=Z_{TH}(\Omega)P_{DISS}(\Omega) \quad (11)$$

The part changing with the input signal is more concerned. $Z_{TH}(\Omega)$ is AC thermal resistance defined in frequency domain, its corresponding impulse response in time domain is:

$$z_{TH}(t) = \frac{1}{2\pi} \cdot \int_{-\infty}^{t} Z_{TH}(\Omega) \cdot e^{j\Omega t} \cdot d\Omega \quad (12)$$

The relationship between the change of the chip surface temperature and the input signal can be calculated by time domain convolution based on the impulse response:

$$T_{VAR}(t)=\int_{-\infty}^{t} z_{TH}(t-\tau) \cdot P_{DISS}(\tau) \cdot d\tau \quad (13)$$

The corresponding envelope signal in the case of taking thermal memory effect into consideration can be calculated by means of substituting the chip surface temperature of the amplifier determined by formula (10) and (13) into formula (8).

(3) When Electrical Memory Effect is Taken into Consideration

The electrical memory effect is considered in order to improve the accuracy of the pre-distortion compensation. Since the inverse of the integral of the signal reflects the bandwidth of the signal, the compensation signal takes the form of the inverse of weighed integral.

Because the electrical memory effect of the amplifier is mainly caused by the change of the input impedance of the amplifier with the baseband modulation frequency, one of the possible measures to compensate for electrical memory effect is to inject a specific signal at the input of the amplifier according to the principle of active impedance, and the signal will keep the input impedance of the amplifier in the range of the baseband modulation frequency constant.

Impedance is defined as the ratio between node voltage and node current. If an external signal source is added, the signal source can regulate the node current, so that the input impedance of the amplifier "observed" at the original input will change with the change of the node current, and this is the principle of active impedance. The principle of active impedance is also used to design the Doherty Amplifier.

The compensation signal for electrical memory effect of the amplifier will be determined according to the active resistant principle hereafter.

Assuming that the frequency characteristic of the input impedance of the amplifier is known, its corresponding impulse response in time domain is:

$$z_{IN}(t) = \frac{1}{2\pi} \cdot \int_{-\infty}^{t} Z_{IN}(\omega) \cdot e^{j\omega t} \cdot d\omega \quad (14)$$

When the input signal is a current, the corresponding voltage at the input node is:

$$V_{IN}(\omega)=I_s(\omega) \cdot Z_{IN}(\omega) \quad (15)$$

In time domain, the above formula is:

$$v_{IN}(t)=\int_{-\infty}^{t} i_s(\tau) \cdot z_{IN}(t-\tau) \cdot d\tau \quad (16)$$

At this time, the transient input impedance of the circuit is:

$$z_{load}(t) = \frac{v_{IN}(t)}{i_S(t)} = \frac{\int_{-\infty}^{t} i_S(\tau) \cdot z_{IN}(t-\tau) \cdot d\tau}{i_S(t)} \quad (17)$$

Assuming that the input impedance of the amplifier will be compensated to an invariable value $z_0$, and according to the principle of active resistance, Therefore $$z_{eff}(t) = \left[1 + \frac{i_{inj}(t)}{i_S(t)}\right] \cdot z_{load}(t) \quad (18)$$

$$i_{inf}(t) = i_S(t) \cdot \left(\frac{z_0}{z_{load}(t)} - 1\right) = i_S(t) \cdot \left(\frac{z_0 \cdot i_S(t)}{\int_{-\infty}^{t} i_S(\tau) \cdot z_{IN}(t-\tau) \cdot d\tau} - 1\right) \quad (19)$$

If the input signal is voltage, the "impedance" in the integral expression of the denominator of the above formula should be replaced with "admittance", and the current source should be replaced with a voltage source, while the form of the expression unchanged.

Because the electrical memory effect and thermal memory effect are independent to each other, the influence to each other can be ignored. A complete out-of-band pre-distortion signal should be the superposition of all of the envelope injection signals (thermal memory effect envelope injection signal, electrical memory effect envelope injection signal, and envelope injection signal used to correct AM-AM distortion characteristic of the amplifier), that is:

the whole envelope injection signal=the envelope injection signal used to correct the AM-AM distortion characteristic of the amplifier+the calorifics memory effect envelope injection signal+the electrics memory effect envelope injection signal (20)

After the envelope injection signal generated according to formula (20) are injected into the amplifier together with the RF signal carrying the information of original signal, the memory effects and the non-linearity of the amplifier will be eliminated.

In the above-mentioned method, to prevent disadvantageous influence on the pre-distortion linearization effect due to the change of the environmental parameters and the aging and shift of the amplifier parameters, one part of the output of the power amplifier, as a feedback reference signal, is compared with the original input signal in time domain or frequency domain, and the model parameters of the amplifier for generating the in-band pre-distortion signal and the out-of-band pre-distortion signal is adaptively regulated based on the comparison result, so that the feedback reference signal can be quite close to the original input signal. The adaptive regulation includes two different stages. The first stage is an initial model parameter setting stage, in which the whole system operates under "model parameter identification mode". In the second stage, the system regulates the whole or part of the model parameters of the amplifier, and the whole system operates under "model parameter adaptive regulation mode". Under "model parameter identification mode", the regular operation of the amplifier is interrupted, and certain specific signals are input to the amplifier, so that the system can determine the initial values of the amplifier's model parameters for describing the characteristics of the amplifier by inspecting and comparing the output of the amplifier with the input of it. Under "model parameter adaptive regulation mode", the amplifier operates normally, and the system adaptively regulates the amplifier's model parameters for describing the characteristics of the amplifier by inspecting and comparing the output of the amplifier with the input of it. When the system starts operation or when the structure of the transmitter is adjusted momentously (e.g. replacing an amplifier), a set of initial model parameters of the amplifier is needed, and the system should operate under "model parameter identification mode". The amplifier enters "model parameter adaptive regulation mode" after the initial values of all parameters are determined completely. Under "model parameter identification mode", one set of initial parameters should be determined for each possible operation point of the amplifier, so that there is no need to switch "model parameter adaptive regulation mode" to "model parameter identification mode" when the system switches the operation point of the amplifier.

Here, the detailed process of "model parameter identification" is as follows:

(1) The model parameter of the amplifier is classified into different levels according to the accuracy of the described amplifier models, there is an error level corresponding to each accuracy level, and the amplifier models are classified into three different levels in an embodiment.

The accuracy of the first level model is the lowest, and its model parameters comprise a linear transconductance $g_m$, a second order nonlinear coefficient of the transconductance $K_{2GM}$, a third order nonlinear coefficient of the transconductance $K_{3GM}$, a output conductance $g_o$, a second order nonlinear coefficient of the output conductance $K_{2GO}$, a third order nonlinear coefficient of the output conductance $K_{3GO}$, a second order input-output cross transconductance $K_{2GMGO}$, a third order input leading cross transconductance $K_{3GM2GO}$, a third-order output leading cross transconductance $K_{3GMGO2}$, a linear phase conversion coefficient $\phi$, a amplification factor of the forward voltage of the amplifier $g_V$, and a loop delay $\tau$.

The accuracy of the second model is higher than the first level. The amplifier model of the second level further comprises the following parameters on the basis of the first level model parameters, i.e. a set of FIR filter parameters describing the temperature impulse response of the amplifier, including a delay factor and a weighted coefficient.

The accuracy of the third level model is higher than the second level, the amplifier model of the third level further comprises the following parameters on the basis of the second level model parameters, i.e. a set of FIR filter parameters describing the input impedance of the amplifier varying with the change of the modulation frequency of the input signal, which includes a delay factor, a weighted coefficient, and two proportional factors.

(2) After classification of the levels of the amplifier's model parameters, the amplifier model parameters of the first level is extracted, an initial value is calculated for each model parameter of the first level, then the model parameters of the first level are regulated adaptively until the error is reduced to certain extent or the times of the adaptive iteration reach a predetermined value. The method for calculating the initial value of the first level model parameters is as follows:

Forward voltage amplification factor of the amplifiers $g_V$: the input signal of the amplifier is regulated to a value small enough to render no apparent nonlinear distortion; the relative amplitude of the voltage of the corresponding input signal is compared with that of the feedback signal, if the gain of the feedback branch is known, the forward voltage amplification factor of the amplifier can be calculated directly; $g_V$ can also be predetermined by the specification of the amplifier.

Linear phase conversion coefficient $\phi$ and the loop delay $\tau$: the input signal of the amplifier is multiplied by the feedback signal to obtain a DC value in proportion to the input signal, that is, the DC value is in proportion to the cosine of the relative phase shift, and the relative phase shift is associated with the linear phase conversion coefficient $\phi$ and the loop delay $\tau$. The above measurement and calculation are conducted for two input signals with different frequencies, and the linear phase conversion coefficient $\phi$ and the loop delay $\tau$ are calculated according to the following equation:

$$\phi = \frac{1}{A} \frac{\omega_2 \cdot \arccos 2C_1 - \omega_1 \cdot \arccos 2C_2}{\omega_1 - \omega_2} \quad (21)$$

$$\tau = \frac{\omega_2 \cdot \arccos 2C_1 - \omega_1 \cdot \arccos 2C_2}{\omega_1 - \omega_2} \quad (22)$$

Where, $C_1$ and $C_2$ are DC values measured twice respectively, $\omega_1$ and $\omega_2$ are the modulation frequencies of the input signal measured twice respectively, and A is the amplitude of the input signal.

Nine conductance coefficients: the partial derivative of the output current with respect to the input bias voltage and the partial derivative of the output current with respect to the output bias voltage are measured on nine adjacent bias points respectively (the output current is obtained from the feedback signal indirectly, and the input bias voltage and the output bias voltage are set by the system), as shown in the following equation:

$$\frac{\partial i_{OUT}}{\partial v_{IN}} = g_m + 2 \cdot K_{2gm} \cdot v_{IN} + 3 \cdot K_{3gm} \cdot v_{IN}^2 + K_{2gmgo} \cdot v_{OUT} + \quad (23a)$$
$$2 \cdot K_{3gm2go} \cdot v_{IN} \cdot v_{OUT} + K_{3gmgo2} \cdot v_{OUT}^2$$

$$\frac{\partial i_{OUT}}{\partial v_{OUT}} = g_o + 2 \cdot K_{2go} \cdot v_{OUT} + 3 \cdot K_{3go} \cdot v_{OUT}^2 + K_{2gmgo} \cdot v_{IN} + \quad (23b)$$
$$2 \cdot K_{3gmgo2} \cdot v_{IN} \cdot v_{OUT} + K_{3gm2go} \cdot v_{IN}^2$$

Thus eighteen measured values are obtained. The nine conductance parameters are resolved from eighteen equations created using the eighteen measured values. Redundant equations provide the model parameters with the necessary redundancy;

The above calculation provides necessary initial values for the adaptive regulation of the model parameters of the first level. Before all of the initial values are calculated, the in-band and the out-of-band pre-distortion correction corresponding to the model of this level are not performed.

(3) The accuracy of the amplifier model is increased to the second level, that is, the thermal memory effect model of the amplifier is included. An initial value is calculated for each newly introduced model parameter, and then the model parameters of this level are regulated adaptively to reduce the error continuously until a given level is reached or the times of adaptive iteration gets to a predetermined value.

The initial values of the second level model parameters, that is, the initial values of the thermal FIR filter parameters are determined according to the curve of the temperature impulse response of the amplifier, which provides the adaptive regulation of the second level model parameters with necessary initial values. Before all of the initial values are calculated, the in-band and the out-of-band pre-distortion correction corresponding to the model of this level are not performed.

(4) The accuracy of the amplifier model is increased to the third level, that is, electrical memory effect model of the amplifier is included. An initial value is calculated for each new introduced model parameter, and then the model parameters of this level are regulated adaptively to reduce the error continuously until a given level is reached or the times of adaptive iteration gets to a predetermined value.

The initial values of the third level model parameters, that is, the initial values of the electrical FIR filter parameters are determined according to the curve of the amplifier input impedance changing with the modulation frequency of the input signal. The initial values of two proportional factors of the electrical FIR filter are two set values, $K_1$ is set to be a constant impedance $z_o$, $K_2$ is set to be a constant, i.e., 1, (shown in FIG. 8). This provides the necessary initial values for the adaptive regulation of the model parameters of the third level. Before all of the initial values are calculated, the in-band and the out-of-band pre-distortion correction corresponding to the model of this level are not performed.

(5) After the amplifier model parameters of all levels are calculated, the system enters "model parameter adaptive regulation mode". Since all amplifier model parameters will be regulated adaptively, and those model parameters are only the presentational model parameters of the amplifier, it is not necessary to calculate the initial values of the model parameters accurately.

When the system operates under "model parameter identification mode", that is, the initial values of the model parameters are calculated, certain special input signals need to be arranged, and the amplifier cannot perform amplification normally at this time. When all model parameters of the amplifier are provided with initial values, the system enters "adaptive parameter regulation mode", and the adaptive parameter regulation can be performed as the amplifier operates normally without interrupting normal operation of the amplifier and without having the regulation performed while the amplifier is unused.

In the above method, the "model parameter adaptive regulation" is carried out by calculating the pre-distortion compensation coefficient according to the initial values of the model parameters; compensating the input baseband signal using the calculated pre-distortion compensation coefficient; comparing the feedback signal and the original input signal of the amplifier under the time domain or the frequency domain after they are aligned with respect of time; generating an error signal from the comparison, the error signal indicating the difference between the amplifier model and the actual amplifier, ending the adaptive parameter regulation if the error signal is within the given scope, and regulating the initial model parameters continuously according to the adaptive iterative algorithm until the error is reduced below the given value if the error signal is out of the given scope of the error.

In the method according to the present invention, the adaptive algorithm of the model parameters except FIR filter parameters can be the least mean square (LMS) algorithm, the recursion least mean square error (RLS) algorithm and the like. The adaptive algorithm of FIR filter parameters can be Kalman filtering algorithm and the like. When the model parameters except FIR filter parameters are regulated adaptively, FIR filter parameters are kept constant and when FIR filter parameters are regulated adaptively, the model parameters except FIR filter parameters are kept constant. An adaptive strategy is that the model parameters except thermal and electrical FIR filter parameters are regulated adaptively, then thermal FIR filter parameters are regulated adaptively if the regulated linearity of the amplifier cannot meet the requirement, and electrical FIR filter parameters are regulated adaptively if the requirement still cannot be met.

Since real-time calculation and digital filtering are used to correct nonlinear distortion of the amplifier, which make full use of the correlation between the compensation parameters, a compensation parameter table occupying a lot of storage space used in the conventional digital pre-distortion method is no more needed and can be replaced by a set of model parameters of the amplifier stored in a parameter memory. This set of model parameters of the amplifier for describing the electrical and thermal characteristics of the amplifier generates in-band pre-distortion signal and out-of-band pre-distortion signal in the manner of real-time processing. And these parameters are regulated adaptively, so that the linearization performance and the linearization bandwidth of the pre-distortion will not be influenced by aging and shift of the amplifier and the change of external environment.

The present invention will now be described with reference to the drawings.

Figure 4:
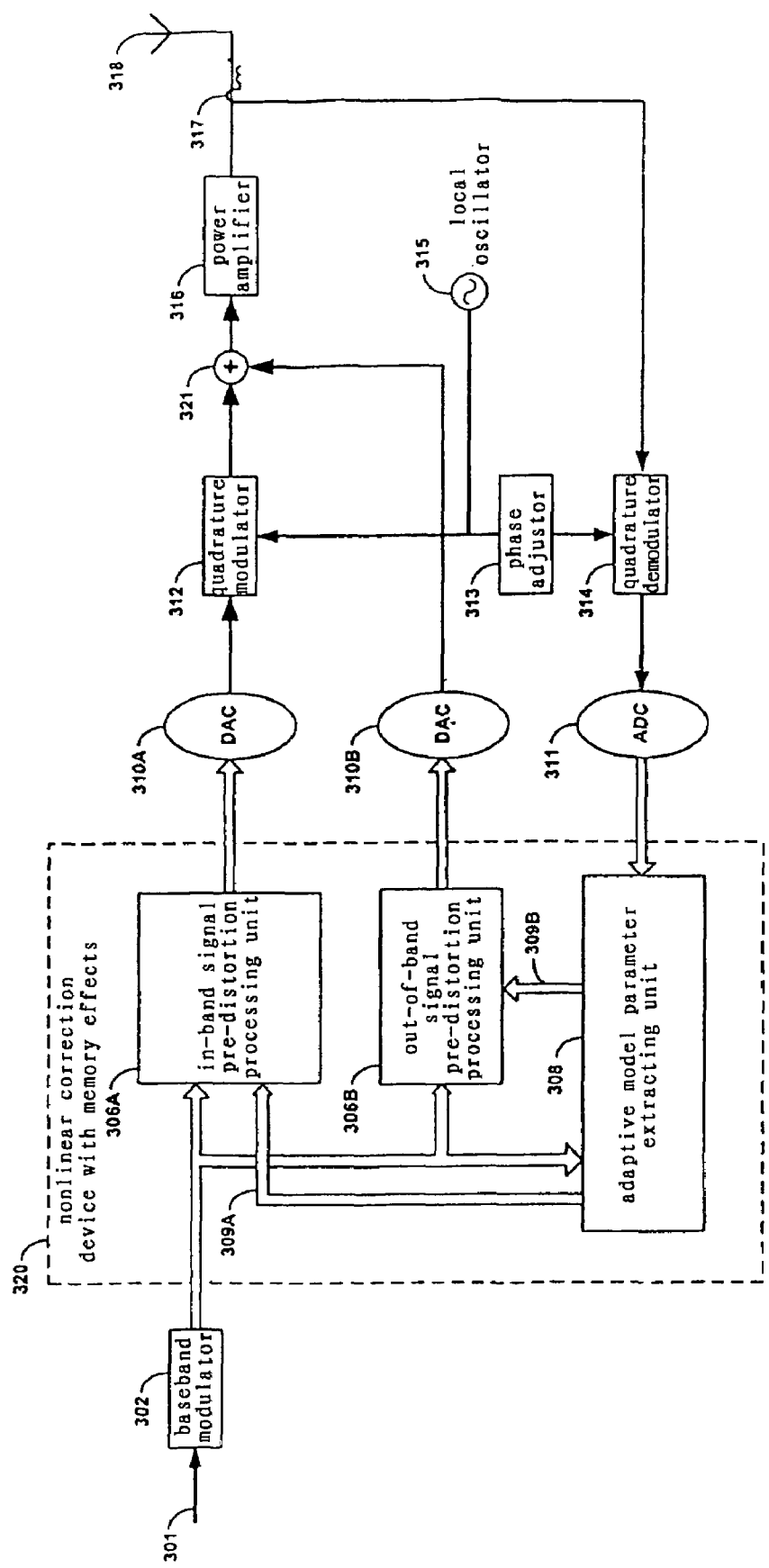
FIG. 4-11 as a whole shows a preferred embodiment of the present invention.

FIG. 4 is a schematic block diagram showing a wideband pre-distortion linearization system with the features of the present invention. An input signal 301 is modulated to a digital baseband signal by a baseband modulator 302, and then the digital baseband signal is corrected by a nonlinear correction device with memory effect 320. The correction includes the following steps. An in-band pre-distortion compensation for the input signal is performed by an in-band signal pre-distortion processing unit 306A, generating an in-band pre-distortion signal; an out-of-band pre-distortion compensation for the input signal is performed by an out-of-band signal pre-distortion processing unit 306B, generating an out-of-band pre-distortion signal. The in-band pre-distortion signal and the out-of-band pre-distortion signal are converted respectively to analog signals by digital/analog converter 310A and digital/analog converter 310B, wherein the analog in-band pre-distortion signal is up-converted to a RF in-band pre-distortion signal via quadrature modulator 312, and the analog out-of-band pre-distortion signal is not up-converted, but added to the RF in-band pre-distortion signal directly in signal summer 321, to generate a compound signal, which is radiated by antenna 318 after being amplified by power amplifier 316. A part of the output signal of the power amplifier 316 is coupled into a feedback branch by a signal coupler 317 as a feedback signal, and then the feedback signal is demodulated in quadrature and down converted to the analog baseband by a quadrature demodulator 314, later a analog/digital converter 311 converts the analog feedback signal to the digital baseband. The feedback signal is compared with the original input signal by an adaptive model parameter extracting unit 308 in the digital baseband, to generate two parameter updating signals 309A and 309B which are used to update the compensation parameters of the in-band signal pre-distortion processing unit and the compensation parameters of the out-of-band signal pre-distortion processing unit, respectively. In above device, the local oscillation signals of the quadrature modulator 312 and the quadrature demodulator 314 are provided by a local oscillator 315, and the phase of the local oscillation signal of the reverse branch is regulated by a phase regulator 313, so that there is a certain phase difference between the regulated phase and the local oscillation signal of the forward direction branch, in order to compensate the RF shift between the forward direction branch and the reverse branch.

The in-band signal pre-distortion processing unit includes three parts. The first part is an in-band memoryless nonlinear pre-distortion correction unit for correcting the memoryless nonlinear pre-distortion of the amplifier, which is a device performing pre-distortion correction of the input signal in a real-time manner according to the model parameters of the amplifier, the method of correction calculation is described by equation (5), and this part is used to correct AM-PM distortion characteristic of the amplifier. The second part is a finite impulse response filter, which is used to correct linear frequency distortion associated with analog/digital converter and digital/analog converter. The third part is used to correct distortion due to mismatch between the gain and the phase of the undesired quadrature modulator-demodulator, and correct distortion and carrier frequency leakage due to DC offsetting of the system.

Figure 5:
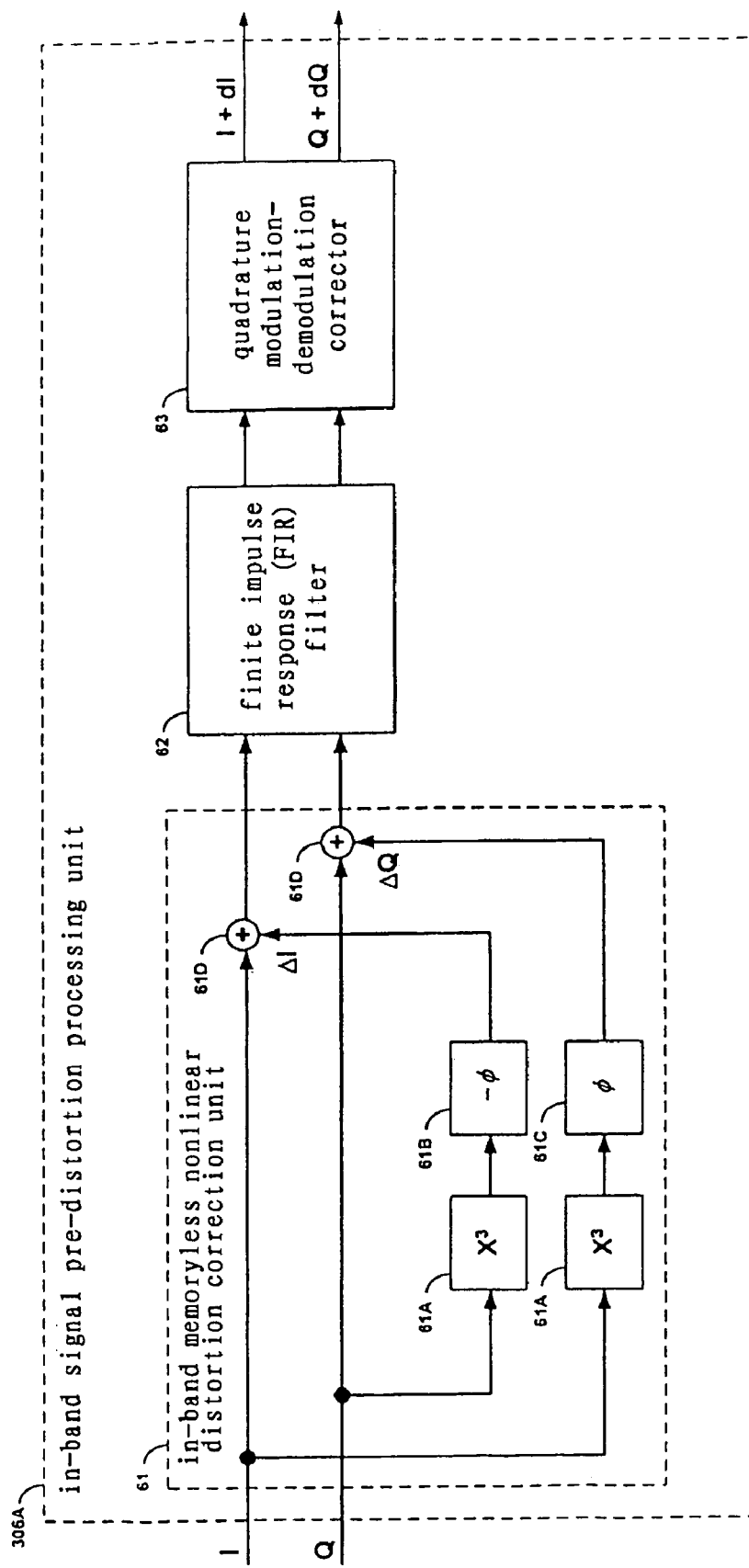

FIG. 5 is a schematic block diagram showing in-band signal pre-distortion processing unit 306A. The memoryless non-linearity of the amplifier is corrected by the in-phase component (I signal) and the quadrature component (Q signal) of the baseband signal via an in-band memoryless non-linear distortion correction unit 61. The in-band memoryless nonlinear distortion correction unit 61 includes four parts: (two) cube generator 61A for acquiring the cube of the input signal; two fixed parameter multipliers 61B and 61C, wherein the fixed parameter multiplier 61B is used to multiply the input signal by a factor-φ, and the fixed parameter multiplier 61C is used to multiply the input signal by a factor φ; (two) signal summer 61D. The baseband in-phase (I) channel signal is multiplied by a factor φ via the fixed parameter multiplier 61C after cubed by the cube generator 61A, to generate a quadrature component correction signal ΔQ; The baseband quadrature (Q) channel signal is multiplied by a factor −φ via the fixed parameter multiplier 61C after cubed by another cube generator 61A, to generate an in-phase component correction signal ΔI; the in-phase component correction signal ΔI is added to the original in-phase component I in summer 61D, to generate a nonlinear pre-distortion signal of the in-phase component I+ΔI, and the quadrature component correction signal ΔQ is added to original quadrature component Q in summer 61D, to generate a nonlinear pre-distortion signal of the quadrature component Q+ΔQ. The frequency distortion of the corrected signals (I+ΔI, Q+ΔQ), which is resulted by the analog/digital converter and the digital/analog converter, is corrected by a finite impulse response (FIR) filter 62, and the distortion and the carrier frequency leakage of the corrected signals (I+ΔI, Q+ΔQ), which is resulted by the mismatch between the gain and the phase of the undesired quadrature modulator-demodulator and DC offsetting of the system, is corrected by a quadrature modulation-demodulation corrector 63, finally generating in-band pre-distortion signal (I+dI, Q+dQ).

The out-of-band signal pre-distortion processing unit according to the present invention includes four parts. The first part is a power envelope calculating device for calculating the power envelope of the input signal. The baseband signals in radio communication usually consist of an I (in-phase) channel component and a Q (quadrature) channel component, therefore the power envelope of the signal is $I^2+Q^2$. The second part is a proportional corrector for generating a correction signal in proportion to the power envelope of the input signal, which is used to correct AM-AM distortion of the amplifier. The third part is a thermal memory effect corrector, which is a finite impulse response (FIR) filter, i.e. thermal FIR filter for short, and the filter is used to filter the input power envelope signal, so as to generate a envelope injection signal for correcting thermal memory effect of the amplifier. The fourth part is an electrical memory effect corrector, the main structure of which is also a finite impulse response (FIR) filter, therefore it is known as electrical FIR filter for short, and the filter is used to generate an envelope injection signal for correcting electrical memory effect of the amplifier. The above envelope injection signals, i.e. the proportional envelope injection signal, the thermal memory effect envelope injection signal and the electrical memory effect envelope injection signal are superposed at the output of the out-of-band signal pre-distortion processing unit to generate a complete envelope injection signal.

Figure 6:
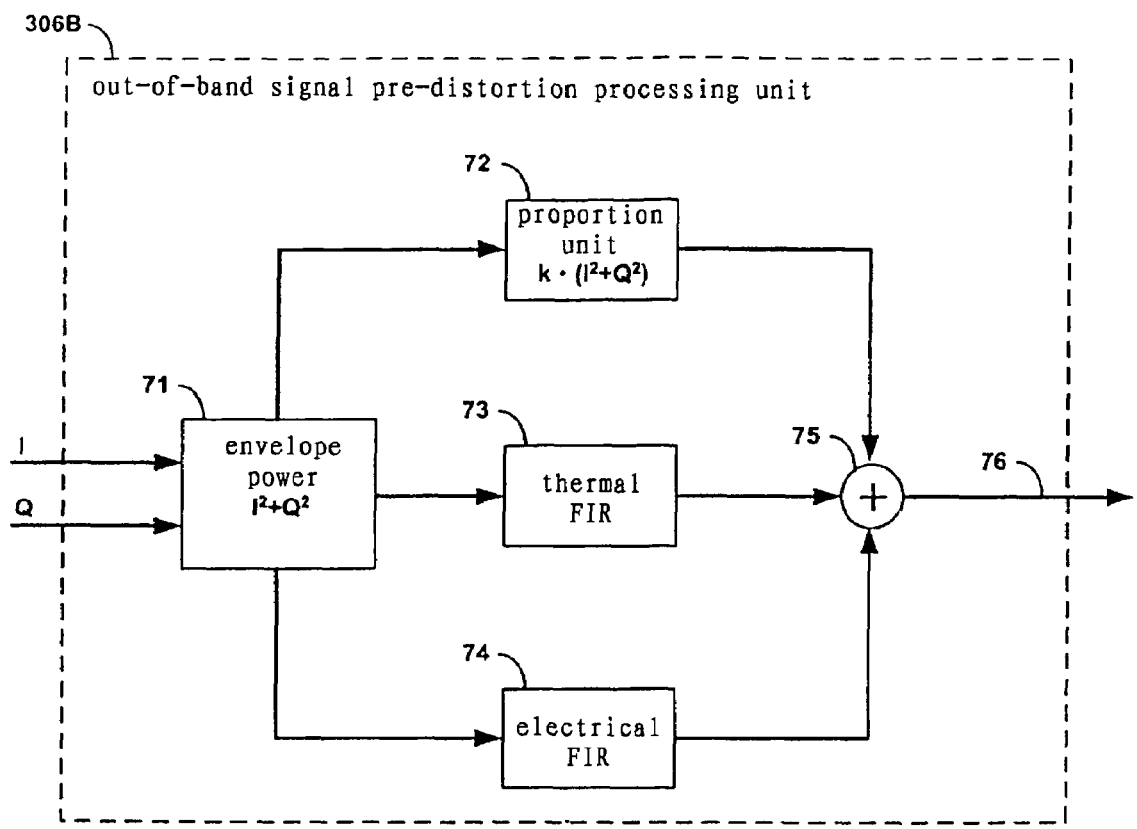

FIG. 6 is the schematic block diagram showing an embodiment of the out-of-band signal pre-distortion processing unit according to the present invention. This device is mainly used to compensate memory effects of the amplifier and its operation principle is as follows. Firstly, the baseband signal is input and its power envelope is calculated by a power envelope calculating device, the power envelope is divided into three ones: the first one is used to generate a compensation signal proportioned to the input signal power envelope via a proportion unit 72, the compensation signal is used to compensate memory less non-linearity associated with AM-AM distortion characteristic of the amplifier; the second one is used to generate a compensation signal for compensating thermal memory effect of the amplifier via thermal FIR filter 73; the third one is used to generate a compensation signal for compensating the electrical memory effect of the amplifier via the electrical FIR filter 74; these three compensations are conducted independent of each other, and superposed by a signal summer 75 to generate final out-of-band pre-distortion signal 76.

Figure 7:
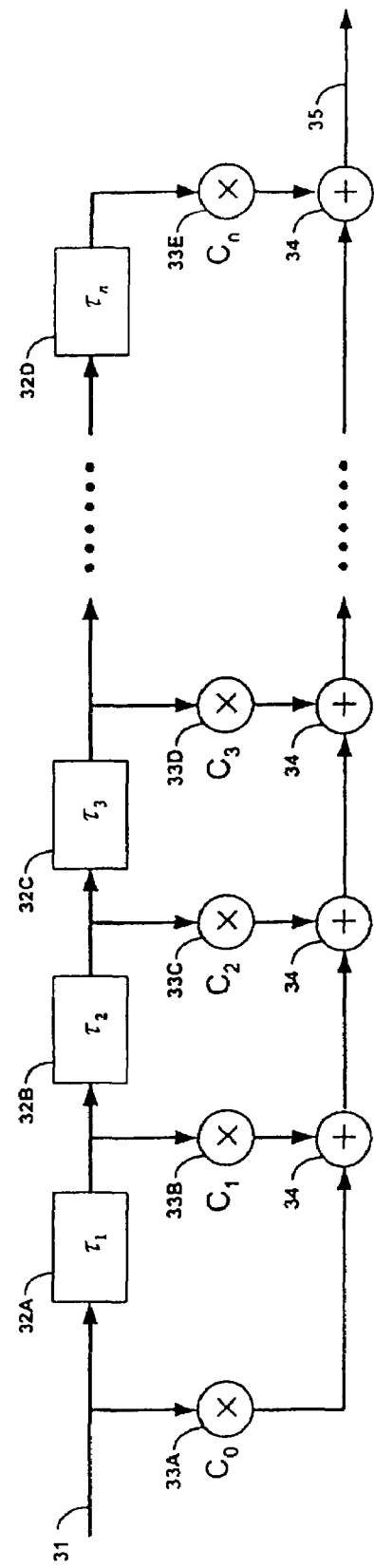

FIG. 7 shows the structure of an embodiment of the thermal memory effect compensation FIR filter according to the present invention. Firstly, the envelope power signal 31 of the input signal is filtered by a FIR filter with predetermined coefficient to generate a compensation signal 35 for thermal memory effect, which is used to compensate thermal memory effect of the amplifier associated with self-heat effect. The weighted coefficients of the weighted factor unit 33A-33E and the delay factors of the delay unit 32A-32D in the thermal memory effect compensation FIR filter are predetermined, the delay factor of each delay unit may differ from each of the weighted coefficient, but they are all updated by the adaptive model parameter exacting unit, and the update is performed under ping-pong structure.

Figure 8:
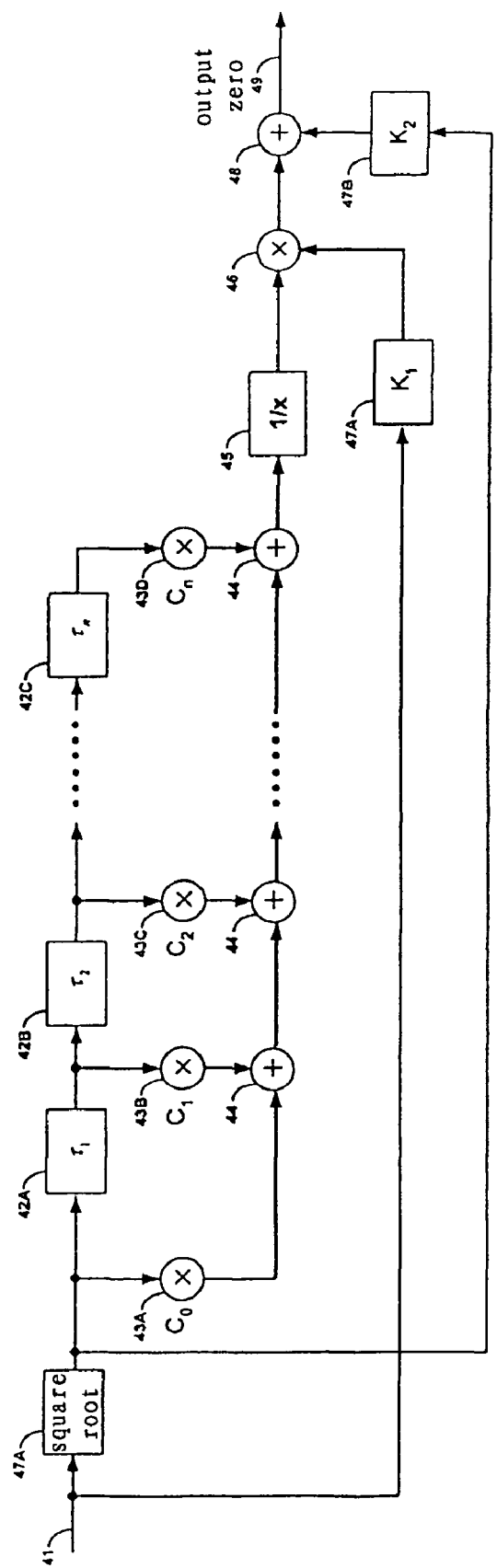

FIG. 8 shows schematically the structure of an embodiment of the electrical memory effect compensation FIR filter according to the present invention. Firstly, the envelope power signal of the input signal enters into a square root generator to obtain the square root corresponding to the input envelope signal, then the square root is filtered by a FIR filter 42-44 having predetermined coefficients, and the reciprocal of the filtered signal is obtained by a divider 45. Before the divider obtains the reciprocal, the following should be judged: Is the input signal larger than a predetermined threshold? If "Yes", the corresponding reciprocal is calculated in normal way, and if "NO", the output of the divider is zero. The purpose of such judgment is to avoid divisor being zero or a very little number during the calculation of the reciprocal. The reciprocal signal is multiplied by a factor proportional to the input envelope signal in an multiplier 46, and then is summed with a factor proportional to the square root of the input envelope signal in an summer 48, finally a compensation signal 49 for electrical memory effect is generated, which is used to compensate electrical memory effect associated with the input biasing circuit, wherein the two proportion units are 47A and 47B, respectively. All the coefficients here are updated by the adaptive model parameter exacting unit, and the update is performed under ping-pong structure.

Figure 9:
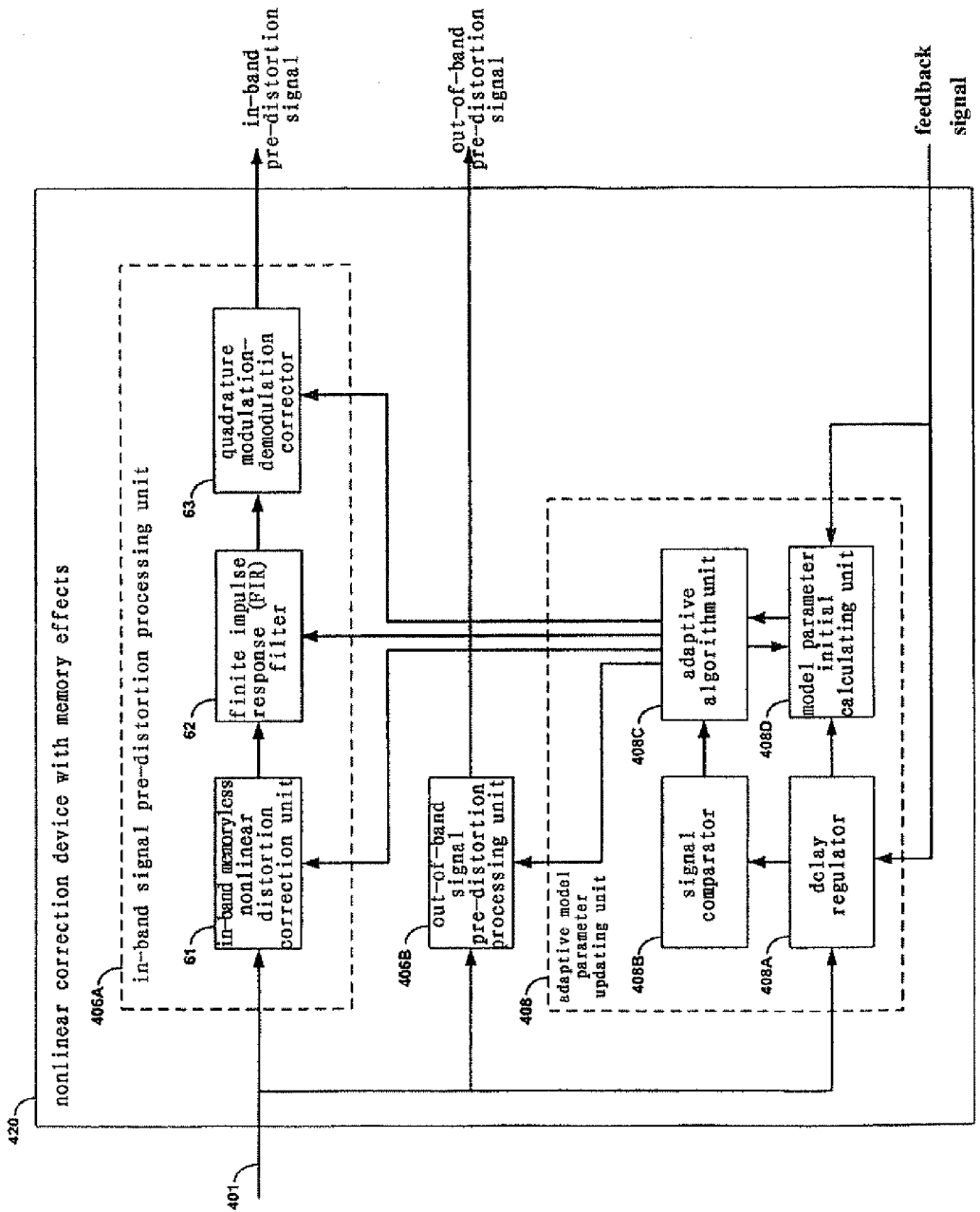

FIG. 9 shows schematically the parameter updating process of the adaptive model parameter updating unit 408 according to the present invention. The adaptive model parameter updating unit 408 includes four parts: a delay regulator 408A, a signal comparator 408B, an adaptive algorithm unit 408C and a model parameter initial calculating unit 408D. The adaptive model parameter updating unit 408 has two operation modes: the model parameter identification mode and the model parameter adaptive regulation mode. When the adaptive model parameter updating unit operates under the model parameter identification mode, the delay regulator 408A regulates the delay difference between the feedback signal and the original signal to have the two signals aligned about time. The model parameter initial calculating unit 408D then calculates the initial value of the amplifier model parameter from the aligned input signal and feedback signal. During the calculation of the initial value, the model parameter initial calculating unit 408D calls the adaptive algorithm unit 408C to regulate part of the model parameters adaptively. When the adaptive model parameter updating unit operates under the model parameter adaptive regulation mode, the delay regulator 408A regulates the delay difference between the feedback signal and the origin signal to have the two signals aligned with regard to time. The aligned signals are compared by signal comparator 408B in time domain or in frequency spectrum to obtain the difference between the feedback signal and the original signal, and this difference is proportional to the degree of distortion of the amplifier; and then the adaptive algorithm unit 408C adaptively regulates the compensation parameters of the in-band signal pre-distortion processing unit and the out-of-band signal pre-distortion processing unit based on the difference signal, the aim of the regulation is to have the difference between the feedback and the original signal less than a predetermined target.

Figure 10:
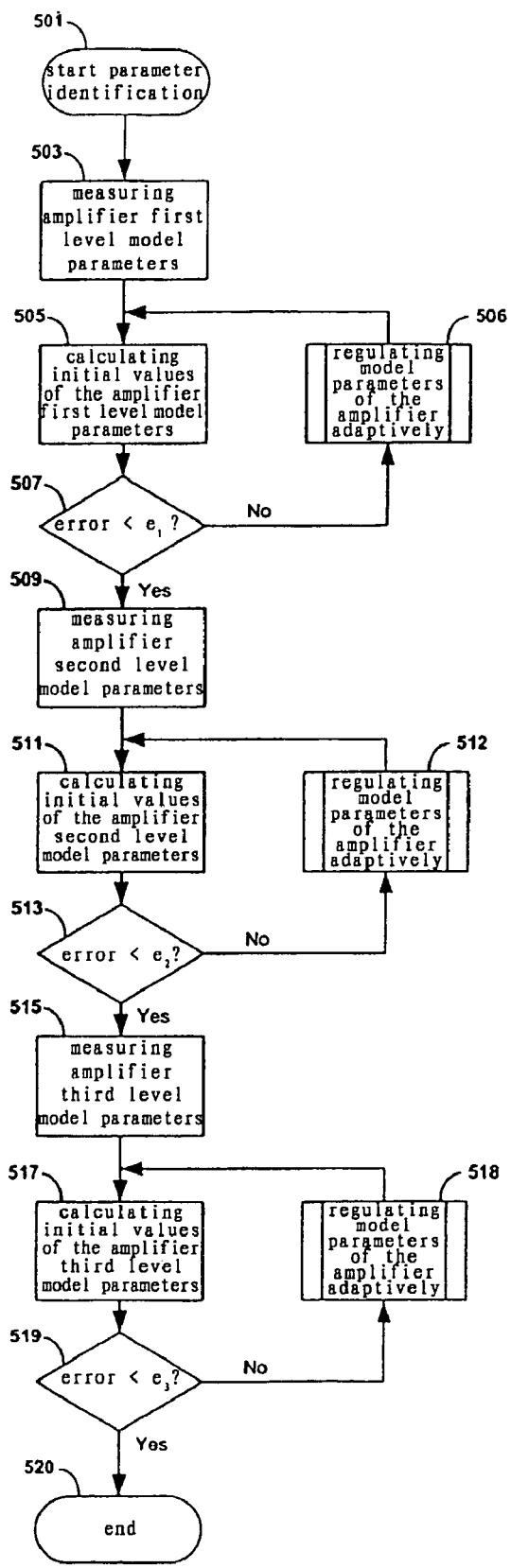

FIG. 10 is a flow chart of the amplifier model parameter identification algorithm according to the present invention. The purpose of model parameter identification is to obtain a set of initial values. In order to simplify the process of the model parameter identification, the amplifier models are classified into three levels. The first level amplifier model is a nonlinear model without considering the memory effect; the second level amplifier model is a nonlinear model with memory effect considering thermal memory effect; and the third level amplifier model is a nonlinear model with memory effect that takes the electrical memory effect into consideration. In the present invention, the hierarchical extracting and hierarchical optimizing strategy is taken in the model parameter identification and the process is as follows. Firstly, first level model parameters of the amplifier are measured (step 503), during measurement, dedicated measurement input signals are used. Then initial values of first level model parameters of the amplifier are calculated based on the measurement result (step 505). After calculating the amplifier non-linearity compensation parameters based on the set of initial values of the model parameters, the non-linearity of the amplifier is compensated and the difference between the feedback signal and the original signal are compared in time domain waveform and in frequency spectrum (step 507), if the error is larger than a predetermined value et, the extracted model parameters are regulated adaptively by calling the adaptive parameter regulation process (step 506, LMS adaptive algorithm) to reduce the error, if the error is less than the predetermined value $e_1$, the second level model parameters of the amplifier is measured to take thermal memory effect of the amplifier into consideration (step 509). The initial values of the amplifier second level model parameters is obtained based on the calculation of the measurement result or predetermined values (step 511), after calculating the non-linearity compensation parameters of the amplifier based on the set of initial values, thermal memory effect of the amplifier is compensated and the difference between the feedback signal and the input signal are compared with respect to time domain waveform and frequency spectrum (step 513), if the error is larger than a predetermined value $e_2$, the newly extracted model parameters are adaptively regulated by calling the adaptive parameter regulation process (step 512, FIR filter adaptive algorithm) to reduce the error, if the error is less than the predetermined value $e_2$, the third level model parameters of the amplifier are measured to introduce electrical memory effect of the amplifier (step 515). The initial values of the amplifier third level model parameters are obtained based on the calculation of the measurement result or predetermined values (step 517). After calculating the non-linearity compensation parameters of the amplifier based on the set of initial values, the electrical memory effect of the amplifier are compensated and the difference between the feedback signal and the input signal are compared with respect to time domain waveform and frequency spectrum (step 519), if the error is larger than a predetermined value $e_3$, the newly extracted model parameters are adaptively regulated by calling the adaptive parameter regulation process (step 518, FIR filter adaptive algorithm) to reduce the error, if the error is less than the predetermined value e3, the model parameter identification process is ended.

Figure 11:
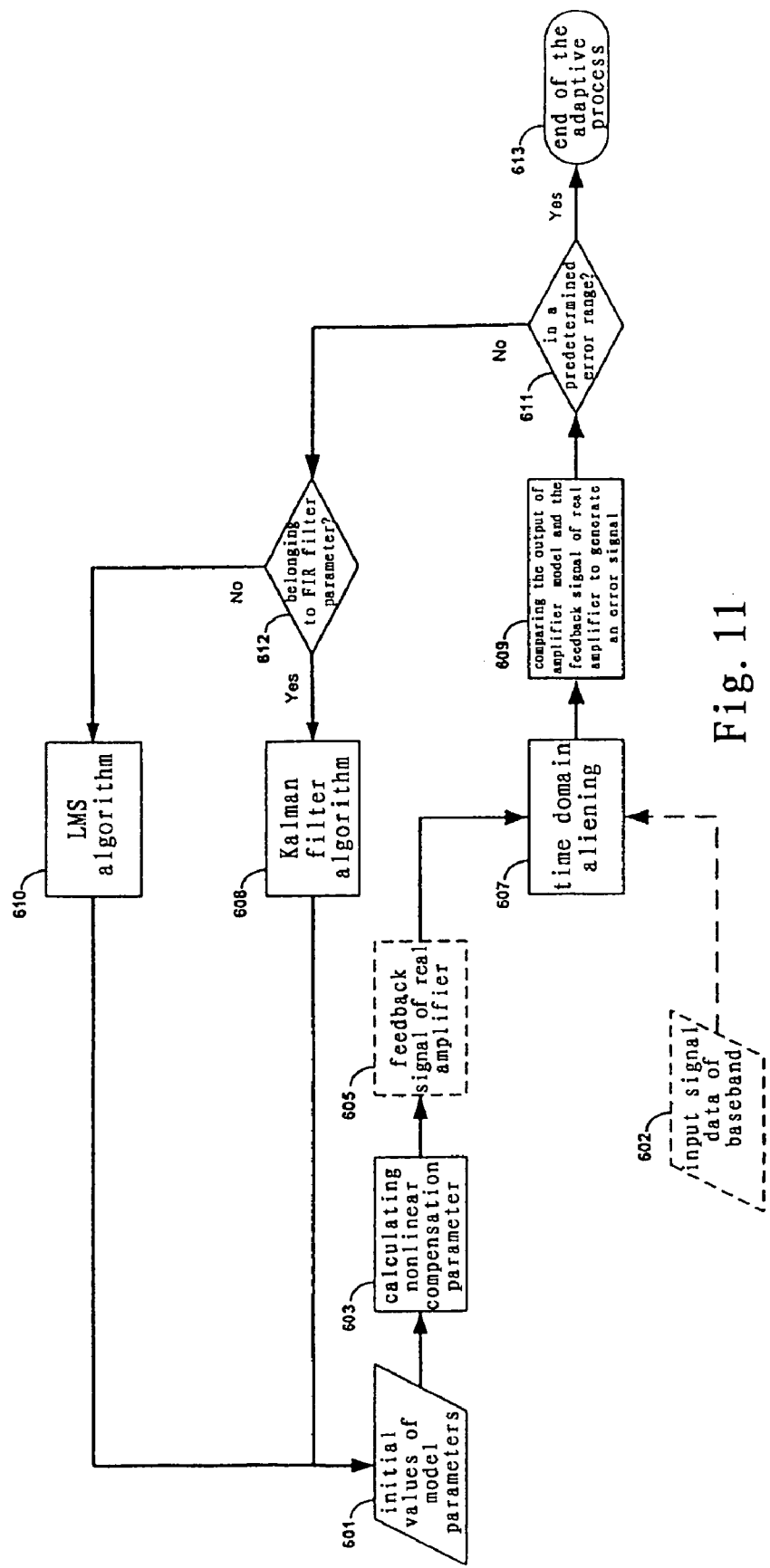

FIG. 11 is the flow chart of the adaptive algorithm of the amplifier model parameters according to the present invention. After obtaining a set of initial values, the model parameter adaptive regulation unit adaptively regulates all the model parameters, to control the intermodulation distortion within a predetermined level. The adaptation process is as follows. Firstly, the nonlinear compensation parameters of the amplifier are calculated based on the initial values of the model parameters (601) (step 603); the compensated output of the amplifier is measured to obtain a feedback reference signal (step 605); the feedback reference signal of the amplifier is aligned with the original input signal in time domain (step 607); the aligned signals are compared (step 609), generating an error signal which reflects the difference between the amplifier model and a real amplifier. A judgment on whether the error signal is within the predetermined error range is made, if "Yes", the adaptive parameter regulation process is ended, and if "NO", a further judgment on whether the parameters to be regulated belong to the FIR filter (step 612), if the answer is "Yes", the parameters of the FIR filter are adaptively regulated by calling the Kaman filter algorithm or the like (step 608), if the answer is "NO", the adaptive regulation which does not belong to the parameters of the FIR filter is performed by calling the LMS algorithm or the like (step 610). The adaptive regulation of the parameters will change the initial values of the parameters, and the next adaptive regulation process will be on the basis of the previous regulated parameters. The cycle is repeating until the error between the last feedback signal and the original signal is less than the predetermined value.

The present invention removes the limitation to the bandwidth and the performance of the pre-distortion system due to the memory effects, and achieves wideband and high performance of the digital pre-distortion linearization technique, by means of an innovative wideband pre-distortion method. At the same time, the present invention simplifies the design of the pre-distortion system greatly, and reduces its cost.

The present invention can be used in, but not limited to the applications requiring wideband linear amplification, such as base station subsystem of the third generation mobile communication system, wireless LAN, etc. It can also be used to linearize power amplifiers of mobile terminals with minor modification.

The invention claimed is:

1. A wideband pre-distortion linearization method for removing the influence of a memory effect in a RF power amplifier and extending a linearization bandwidth of digital pre-distortion, comprising:
    performing in-band pre-distortion compensation for an input signal according to characteristic parameters of said amplifier, to obtain an in-band pre-distortion signal;
    performing out-of-band pre-distortion compensation for said input signal according to characteristic parameters of said amplifier, to obtain an out-of-band pre-distortion signal;
    up-converting said in-band pre-distortion signal;
    adding said up-converted in-band pre-distortion signal to said out-of-band pre-distortion signal which is not up-converted, at an input of said power amplifier; inputting the added signal to said power amplifier as an input signal;
    taking a part of an output of said power amplifier as a feedback signal and comparing it with an original input signal;
    regulating adaptively characteristic parameters of the amplifier used for generating the in-band pre-distortion signal and the out-of-band pre-distortion signal according to the comparison result, so as to have the feedback signal close to that of the original input signal as much as possible in terms of waveform in time domain or frequency spectrum.

2. The method according to claim 1, wherein said out-of-band pre-distortion compensation mainly compensates for memory effect of said amplifier, while said in-band pre-distortion compensation mainly compensates for memoryless nonlinear distortion of the amplifier.

3. The method according to claim 2, wherein said in-band pre-distortion compensation comprises at least compensation for nonlinear distortion associated with AM-PM distortion characteristics of said amplifier.

4. The method according to claim 3, wherein said in-band pre-distortion compensation further comprises compensation for linear distortion associated with modulation frequency of said input signal.

5. The method according to claim 3, wherein said in-band pre-distortion compensation further comprises compensation for distortion associated with undesired modulation-demodulation characteristics of an I channel and a Q channel in the system using quadrature modulation-demodulation.

6. The method according to claim 1, wherein said out-of-band pre-distortion compensation comprises compensation for thermal memory effect in said amplifier and compensation for electrical memory effect in said amplifier.

7. The method according to claim 6, wherein said out-of-band pre-distortion compensation further comprises compensation for nonlinear distortion associated with AM-AM distortion characteristics of said amplifier.

8. The method according to claim 1, wherein said adaptive regulation of the characteristic parameter of said amplifier comprises two mode, that is, model parameter identification mode and model parameter adaptive regulation mode.

9. A wideband pre-distortion system for removing influence caused by memory effects in a radio power amplifier and extending linearization bandwidth of a digital pre-distortion, comprising:
    an in-band signal pre-distortion processing unit, a quadrature modulating means, an out-of-band signal pre-distortion processing unit, a signal summer, a RF power amplifier, a quadrature demodulating means, and an adaptive model parameter extracting unit;
    wherein one part of an input signal is used to generate an in-band pre-distortion signal via said in-band signal pre-distortion processing unit, and another part of said input signal is used to generate an out-of-band pre-distortion signal via said out-of-band signal pre-distortion processing unit;
    said in-band pre-distortion signal is modulated and up-converted to a carrier frequency via said quadrature modulating means, and then added with said out-of-band pre-distortion signal which is not up-converted directly at said signal summer;
    a combined signal obtained by the addition is transmitted to said RF power amplifier, and is sent out via an antenna after being amplified;
    a part of an output signal of said RF power amplifier is provided to said adaptive model parameter exacting unit as a feedback signal after quadrature-demodulated and down-converted by said quadrature demodulating means;
    said adaptive model parameter exacting unit compares said feedback signal with an original input signal and generates a parameter updating signal based on such comparison result, said parameter updating signal is provided to said in-band signal pre-distortion processing unit and said out-of-band signal pre-distortion processing unit to adaptively regulate a pre-distortion compensation parameter required by said in-band signal pre-distortion processing unit and said out-of-band signal pre-distortion processing unit.

10. The system according to claim 9, wherein the system further comprises a first digital/analog converter connected between an output of said in-band signal pre-distortion processing unit and said quadrature modulating means, and a second digital/analog converter connected between an output of said out-of-band signal pre-distortion processing unit and said signal summer.

11. The system according to claim 9, wherein the system further comprises an analog/digital converter connected between said quadrature demodulating means and said adaptive model parameter exacting unit.

12. The system according to claim 9, wherein said in-band signal pre-distortion processing unit comprises an in-band memoryless nonlinear distortion correction unit.

13. The system according to claim 12, wherein said in-band signal pre-distortion processing unit further comprises a finite impulse response filtering means.

14. The system according to claim 12 or 13, wherein said in-band signal pre-distortion processing unit further comprises a quadrature modulation-demodulation error correcting means.

15. The system according to claim 9, wherein said out-of-band signal pre-distortion processing unit comprises a power envelope calculation apparatus, a thermal memory effect correction means and an electrical memory correction means.

16. The system according to claim 15, wherein said thermal memory effect correction means is a FIR filter.

17. The system according to claim 15, wherein said electrical memory effect correction means comprises a FIR filter.

18. The system according to claim 15, wherein said out-of-band signal pre-distortion processing unit further comprises a proportion unit.

19. The system according to claim 9, wherein said adaptive model parameter exacting unit comprises a delay regulator, a signal comparator, an adaptive algorithm unit and a model parameter initial calculation unit.

20. The system according to claim 19, wherein said adaptive model parameter exacting unit performs a function of model parameter identification and a function of model parameter adaptive regulation.

21. The system according to claim 13, wherein said in-band signal pre-distortion processing unit further comprises a quadrature modulation-demodulation error correcting means.

* * * * *

UNITED STATES PATENT AND TRADEMARK OFFICE
CERTIFICATE OF CORRECTION

PATENT NO. : 7,583,754 B2 Page 1 of 1
APPLICATION NO. : 10/533494
DATED : September 1, 2009
INVENTOR(S) : Xiaowei Liu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 784 days.

Signed and Sealed this

Fourteenth Day of September, 2010

David J. Kappos
*Director of the United States Patent and Trademark Office*